United States Patent
Lee et al.

(10) Patent No.: US 9,355,592 B2
(45) Date of Patent: May 31, 2016

(54) SOURCE DRIVER AND BIAS CURRENT ADJUSTING METHOD THEREOF

(71) Applicant: SILICON WORKS CO., LTD., Daejeon-si (KR)

(72) Inventors: Sang Min Lee, Daejeon-si (KR); Sun Gun Yoo, Cheongju-si (KR); Ju Pyo Hong, Daejeon-si (KR)

(73) Assignee: SILICON WORKS CO., LTD., Daejeon-Si (KR)

( * ) Notice: Subject to any disclaimer, the term of this patent is extended or adjusted under 35 U.S.C. 154(b) by 0 days.

(21) Appl. No.: 14/333,933

(22) Filed: Jul. 17, 2014

(65) Prior Publication Data

US 2015/0022244 A1    Jan. 22, 2015

(30) Foreign Application Priority Data

Jul. 18, 2013   (KR) .................. 10-2013-0084869

(51) Int. Cl.
*H03K 3/00*   (2006.01)
*G09G 3/32*   (2016.01)
*H03K 17/30*   (2006.01)
*G09G 3/00*   (2006.01)

(52) U.S. Cl.
CPC .............. *G09G 3/3208* (2013.01); *G09G 3/006* (2013.01); *G09G 3/3275* (2013.01); *H03K 17/302* (2013.01); *G09G 2330/028* (2013.01)

(58) Field of Classification Search
CPC .................................................. G09G 3/3208
See application file for complete search history.

(56) References Cited

U.S. PATENT DOCUMENTS 7,233,274 B1 * 6/2007 Kuhn ................. H03M 1/1061
                                                    341/118

* cited by examiner

*Primary Examiner* — Daniel Puentes
(74) *Attorney, Agent, or Firm* — Kile Park Reed & Houtteman PLLC

(57) ABSTRACT

Disclosed are a source driver provided in a display device that displays an image and a bias current adjusting method thereof, and a bias current deviating from a prescribed range is adjusted so that a source driver is driven by a bias current within the prescribed range.

10 Claims, 8 Drawing Sheets

SOURCE DRIVER AND BIAS CURRENT ADJUSTING METHOD THEREOF

BACKGROUND

1. Technical Field

The present disclosure relates to a semiconductor integrated circuit, and more particularly, to a source driver provided in a display device that displays an image and a bias current adjusting method thereof.

2. Related Art

With the development of a communication technology, the use of display devices has rapidly increased. The display devices are mainly used as large screens used in televisions or small screens used in cellular phones.

The display device includes a display panel that displays an image and a plurality of drivers that drive the display panel, wherein the plurality of drivers include source drivers and gate drivers. The source drivers and the gate drivers are manufactured as semiconductor integrated circuits, are packaged, and then are mounted in the display device. The source driver is tested for various parameters at a wafer level or a package level in order to detect a defect occurring by the reason of a design or a manufacturing process or to evaluate operation characteristics. Among various parameters, one is a bias current. The bias current may be provided to an internal output buffer of the source driver, thereby having an influence on the analog output of the source driver.

The display panel includes a plurality of source drivers, wherein deviation of a bias current may exist for each source driver. The deviation of the bias current may occur by the difference of semiconductor manufacturing environments for each source driver. When the deviation of the bias current for each source driver is large, a dimming phenomenon may occur in the display panel by output deviation between the source drivers.

Therefore, the source driver should be manufactured such that the deviation of the bias current is not large. In a test process, a source driver, in which the bias current deviates from a prescribed range, may be determined as a defect, and the source driver determined as a defect may be discarded without being applied to products.

As described above, the defect of the source driver by the bias current deteriorates the yield of the source driver and increases the manufacturing cost.

SUMMARY

Various embodiments are directed to a source driver capable of adjusting a bias current in order to reduce a bias current difference between source drivers, and a bias current adjusting method thereof.

Also, various embodiments are directed to a source driver capable of adjusting a bias current such that a source driver having a bias current deviating from a prescribed range satisfies the prescribed range, and a bias current adjusting method thereof.

In an embodiment, a source driver includes: a bias current supply unit that supplies a bias current adjusted in correspondence with a bias current adjusting signal; and a bias current adjusting signal generation unit that programs trim data by using data provided from an exterior, and provides the bias current adjusting signal corresponding to the programmed trim data.

In an embodiment, a source driver includes: a trimming section that performs programming of trim data by using data provided from an exterior, and provides the programmed trim data; and a decoder that decodes the trim data to output a bias current adjusting signal, and outputs the bias current adjusting signal for driving an output current.

In an embodiment, a bias current adjusting method of a source driver includes: performing a test mode of applying a high voltage corresponding to data corresponding to a range for adjusting a bias current to a plurality of trim cells, and programming trim data in the plurality of trim cells; and performing a read mode of reading the trim data programmed in the plurality of trim cells, and providing the trim data in order to adjust the bias current.

According to the present invention as described above, it is possible to adjust a bias current of a source driver. Consequently, deviation of a bias current for each source driver can be reduced, and a block dim phenomenon occurring in a display panel can be prevented.

Furthermore, a bias current of a source driver, which deviates from a prescribed range, can be adjusted, resulting in the reduction of a defect of the source driver. Consequently, the yield of the source driver can be improved and the manufacturing cost can be reduced.

DETAILED DESCRIPTION

Figure 1:
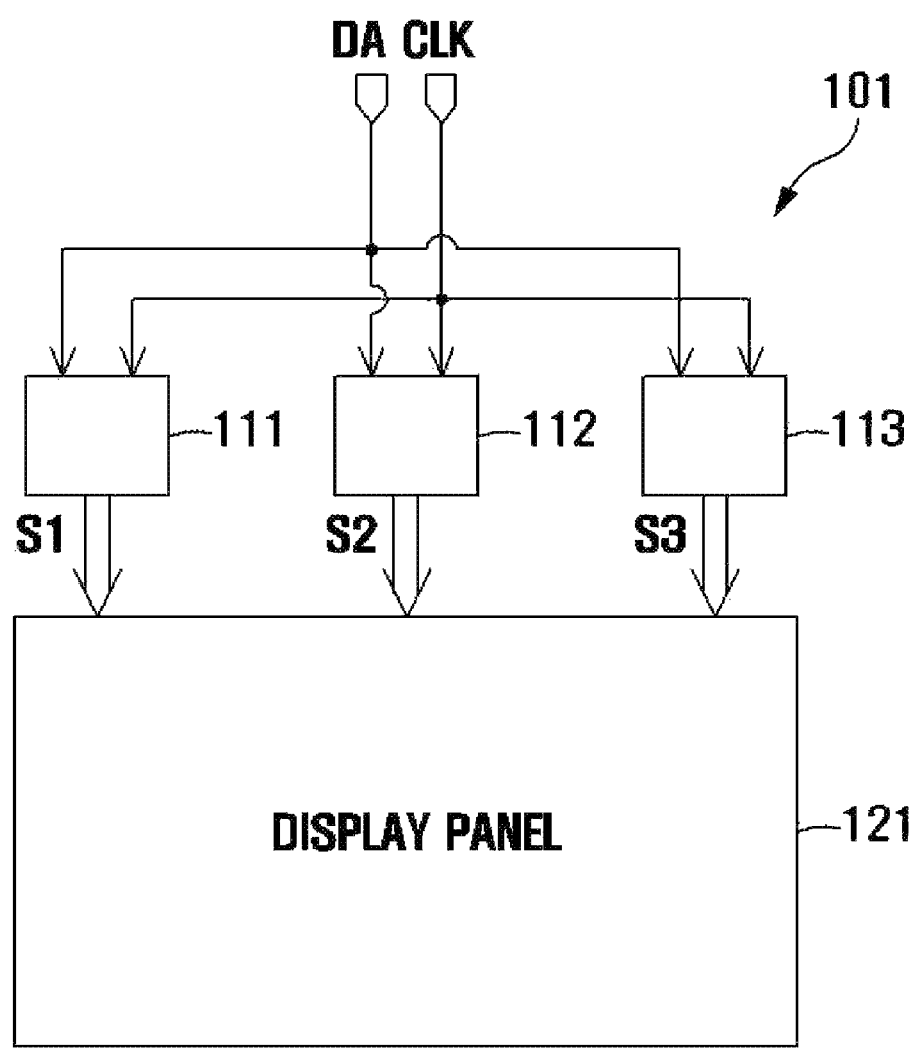
FIG. 1 is a schematic block diagram of a display device provided with a source driver configured as an embodiment of the present invention.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

FIG. 1 is a schematic block diagram of a display device provided with a source driver according to an embodiment of the present invention. Referring to FIG. 1, a display device 101 includes three source drivers 111 to 113 and a display panel 121. In order to drive the display panel 121, the configurations of gate drivers (not illustrated) and peripheral circuits are required. However, for the purpose of convenience, the gate drivers and the peripheral circuits are not illustrated.

The three source drivers 111 to 113 receive a clock signal CLK and image data DA from an exterior, generate three source driving signals S1 to S3 by an internal signal processing process, and output the three source driving signals S1 to S3 to the display panel 121. That is, the three source drivers 111 to 113 process the image data DA by the internal signal processing process in synchronization with the clock signal CLK, thereby outputting the generated source driving signals S1 to S3. The source driving signals S1 to S3 are transferred to a plurality of data lines (not illustrated) of the display panel 121. FIG. 1 illustrates the three source drivers 111 to 113 for the purpose of convenience. However, the number of the source drivers provided in the display device 101 may be variously designed according to the intention of a manufacturer.

The display panel 121 displays an image by using the three source driving signals S1 to S3 that are output from the three source drivers 111 to 113. The display panel 121 may include unit pixels including organic light emitting diodes (OLEDs, not illustrated), and displays an image by the operation of OLEDs corresponding to the three source driving signals S1 to S3. In the display panel 121 according to the embodiment of the present invention, pixels are realized as OLEDs; however, the present invention is not limited thereto, and the display panel 121 may include a liquid crystal display (LCD) display, a light emitting diode (LED) display, an active matrix organic light emitting diode (AMOLED) and the like.

Figure 2:
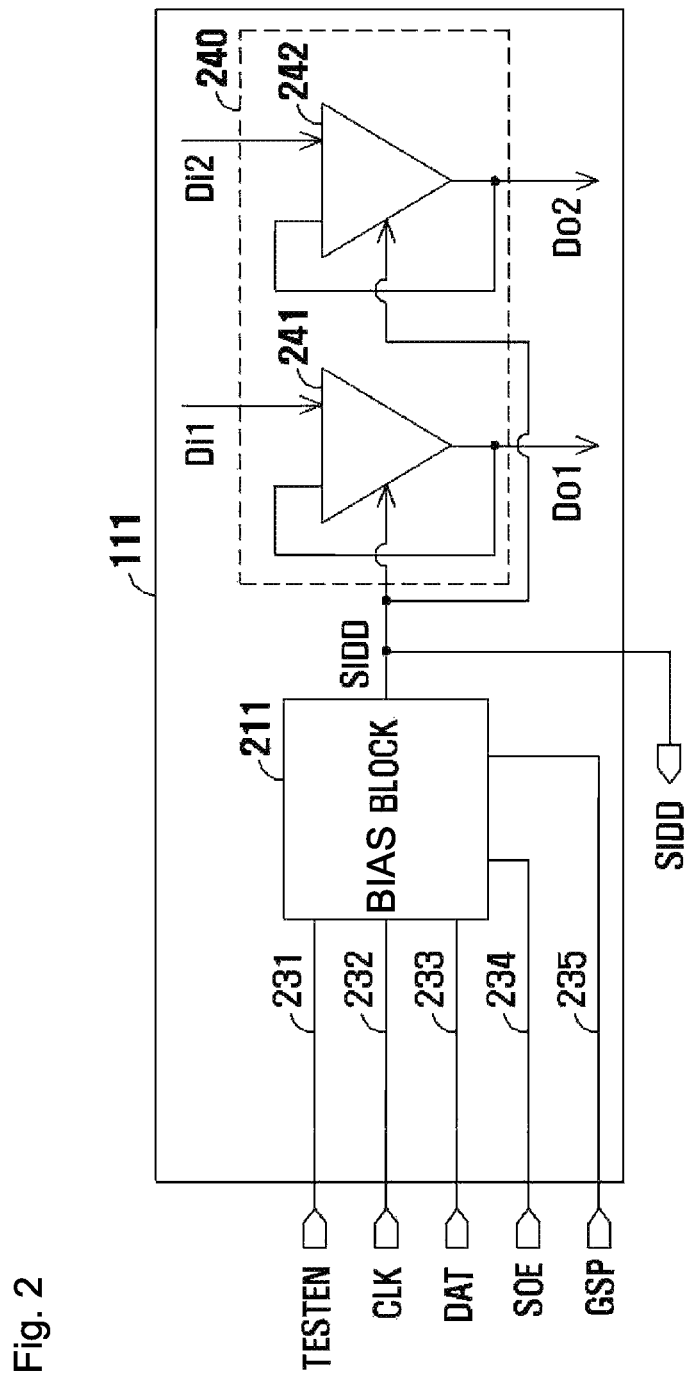
FIG. 2 is a schematic block diagram of a source driver of FIG. 1.

FIG. 2 is a schematic block diagram of the source driver 111 of FIG. 1. The source driver 111 illustrated in FIG. 2 is the first source driver 111 of the three source drivers 111 to 113 illustrated in FIG. 1. The other source drivers 112 and 113 may also have substantially the same configuration as that of the source driver 111.

The source driver 111 of FIG. 2 is configured as a semiconductor integrated circuit, and may include a bias block 211 and a buffering block 240 therein. The bias block 211 may generate a bias current SIDD required for driving the source driver 111, and supply the bias current SIDD to internal circuits. In the embodiment of FIG. 2, the bias current SIDD is supplied to the buffering block 240.

The aforementioned source driver 111 may be tested at a wafer level or a package level after a semiconductor manufacturing process, and it may be determined through the test if the bias current SIDD of the source driver 111 is included in a prescribed range. When the bias current SIDD is included in the prescribed range, the source driver 111 is determined as a good product. However, when the bias current SIDD deviates from the prescribed range, the source driver 111 is determined as a defect. The source driver 111 determined as a good product may be used as parts of the display device, but the source driver 111 determined as a defect may be discarded without being used as the parts of the display device.

According to the embodiment of the present invention, when the bias current SIDD of the bias block 211 deviates from the prescribed range, it is possible to adjust the bias current SIDD to be included in the prescribed range.

The embodiment of the present invention has a function capable of recovering source drivers, which may be determined as a defect because the bias current SIDD deviates from the prescribed range, to a good state. Consequently, the yield of the source drivers can be improved and the manufacturing cost of the source drivers can be lowered.

Furthermore, in order to overcome a block dim phenomenon of the display panel due to deviation of output currents among the source drivers, deviation of the bias current SIDD of the source drivers can be reduced from about ±30% to about ±5% for example.

As described above, the adjustment of the bias current SIDD may be performed by the bias block 211 which will be described later with reference to FIG. 3.

The buffering block 240 receives the bias current SIDD, buffers two source driving signals Di1 and Di2 generated by the internal signal processing process of the source driver 111, and outputs the buffered two source driving signals Do1 and Do2 to the display panel 121. The source driving signals Do1 and Do2 are included in the source driving signal S1. Voltage levels of the two source driving signals Di1 and Di2 generated by the internal signal processing process of the source driver 111 may be different from a voltage level used in the display panel 121. Accordingly, the buffering block 240 performs buffering to adjust the voltage levels of the two source driving signals Di1 and Di2 to a level used in the display panel 121, and outputs the two source driving signals Do1 and Do2 having the adjusted level.

The aforementioned buffering block 240 includes two output buffers 241 and 242. Each of the two output buffers 241 and 242 buffers and outputs one of the two source driving signals Di1 and Di2. FIG. 2 illustrates the two output buffers 241 and 242; however, the number of the output buffers may be expanded to three or more.

First to fourth control signals TESTEN, CLK, SOE, and GSP and data DAT are input to the bias block 211 through interconnections 231 to 235. The bias current SIDD output from the bias block 211 may be output to an exterior of the source driver 211. By using the bias current SIDD output to the exterior of the source driver 211, monitoring for the bias current SIDD may be performed.

Figure 3:
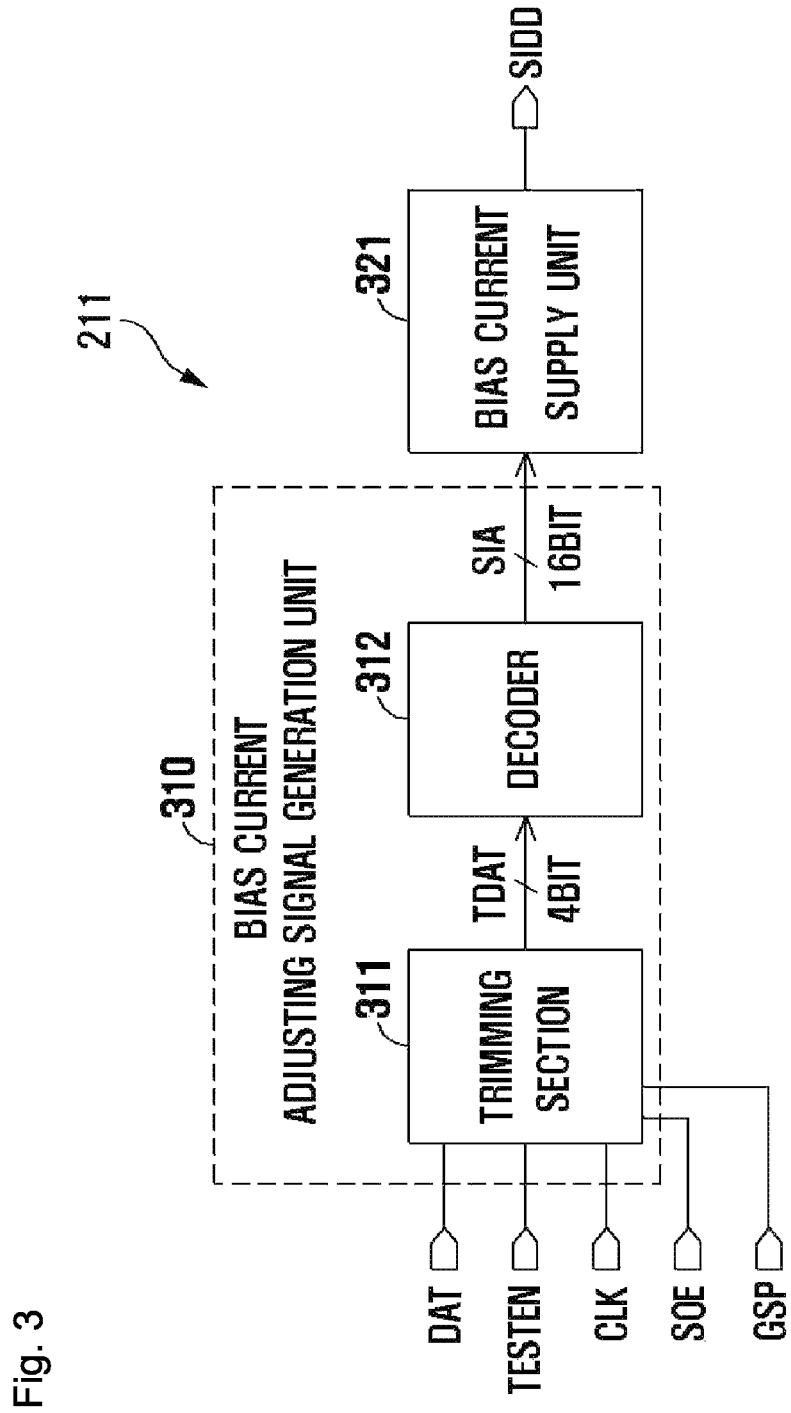
FIG. 3 is a block diagram of a bias block illustrated in FIG. 2.

FIG. 3 is a block diagram of the bias block 211 illustrated in FIG. 2. Referring to FIG. 3, the bias block 211 includes a bias current adjusting signal generation unit 310 and a bias current supply unit 321.

The bias current adjusting signal generation unit 310 generates and provides a bias current adjusting signal SIA for adjusting the bias current SIDD output from the bias current supply unit 321. The bias current adjusting signal generation unit 310 generates the bias current adjusting signal SIA in response to the first to fourth control signals TESTEN, CLK, SOE, and GSP and the data DAT input from an exterior. The third and fourth control signals SOE and GSP may be generated in the source driver 111 or provided by an external timing controller (not illustrated), and an input pad for the case, in which the third and fourth control signals SOE and GSP are provided from an exterior, is not illustrated. The aforementioned bias current adjusting signal generation unit 310 includes a trimming section 311 and a decoder 312.

The trimming section 311 receives the first to fourth control signals TESTEN, CLK, SOE, and GSP and the data DAT input from an exterior, and outputs trim data TDAT for adjusting the bias current SIDD. Particularly, the trimming section 311 performs a test mode and a read mode. In the test mode, when the bias current SIDD deviates from the prescribed range, the trimming section 311 performs an operation for programming the trim data TDAT in four trim cells (511 to 514 of FIG. 5) provided therein in order to adjust the bias current SIDD. In the read mode, the trimming section 311 performs an operation for reading the trim data TDAT programmed in the trim cells (511 to 514 of FIG. 5). The trimming section 311 will be described in detail with reference to FIG. 4 which will be described later.

The decoder 312 is configured to receive the trim data TDAT of the trimming section 311, to generate the bias current adjusting signal SIA having a bit number larger than that of the trim data TDAT through decoding, and to output the bias current adjusting signal SIA to the bias current supply unit 321. For example, the decoder 312 may decode the trim data TDAT of four bits and output the bias current adjusting signal SIA of 16 bits.

The bias current supply unit 321 outputs the bias current SIDD adjusted by the bias current adjusting signal SIA output from the decoder 312. That is, the bias current supply unit 321 outputs the bias current SIDD adjusted to be included in the prescribed range in response to the bias current adjusting signal SIA output from the decoder 312.

Figure 5:
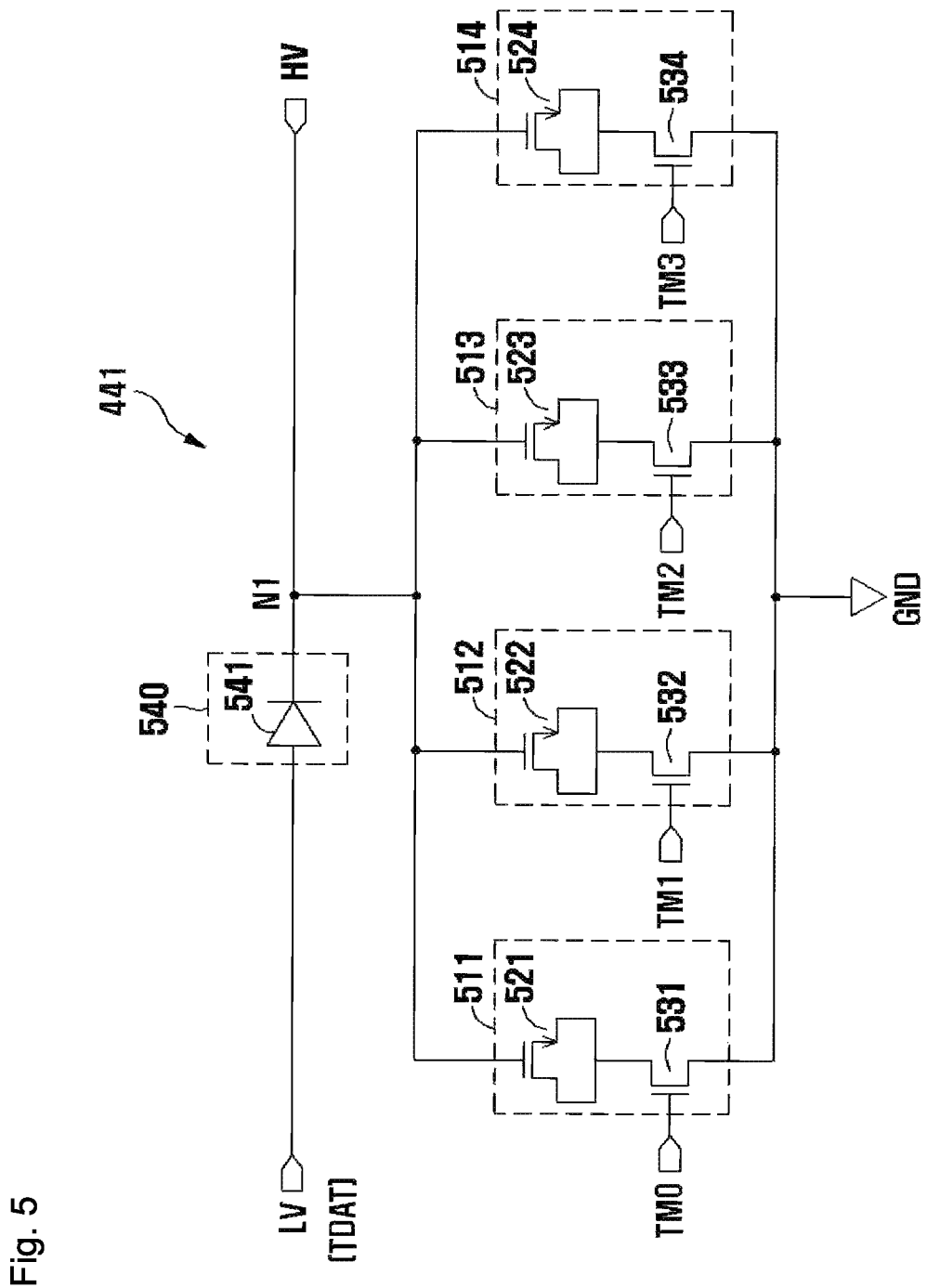
FIG. 5 is a circuit diagram of a trim cell part illustrated in FIG. 4.

The aforementioned bias block (211 of FIG. 2) of the source driver 111 includes the bias current adjusting signal generation unit 310, so that it is possible to program the trim data TDAT in the trim cells (511 to 514 of FIG. 5) in order to adjust the bias current SIDD when the bias current SIDD supplied from the bias current supply unit 321 deviates from the prescribed range, and to provide the bias current SIDD adjusted to be included in the prescribed range by the programmed trim data TDAT of the trim cells (511 to 514 of FIG. 5).

Figure 4:
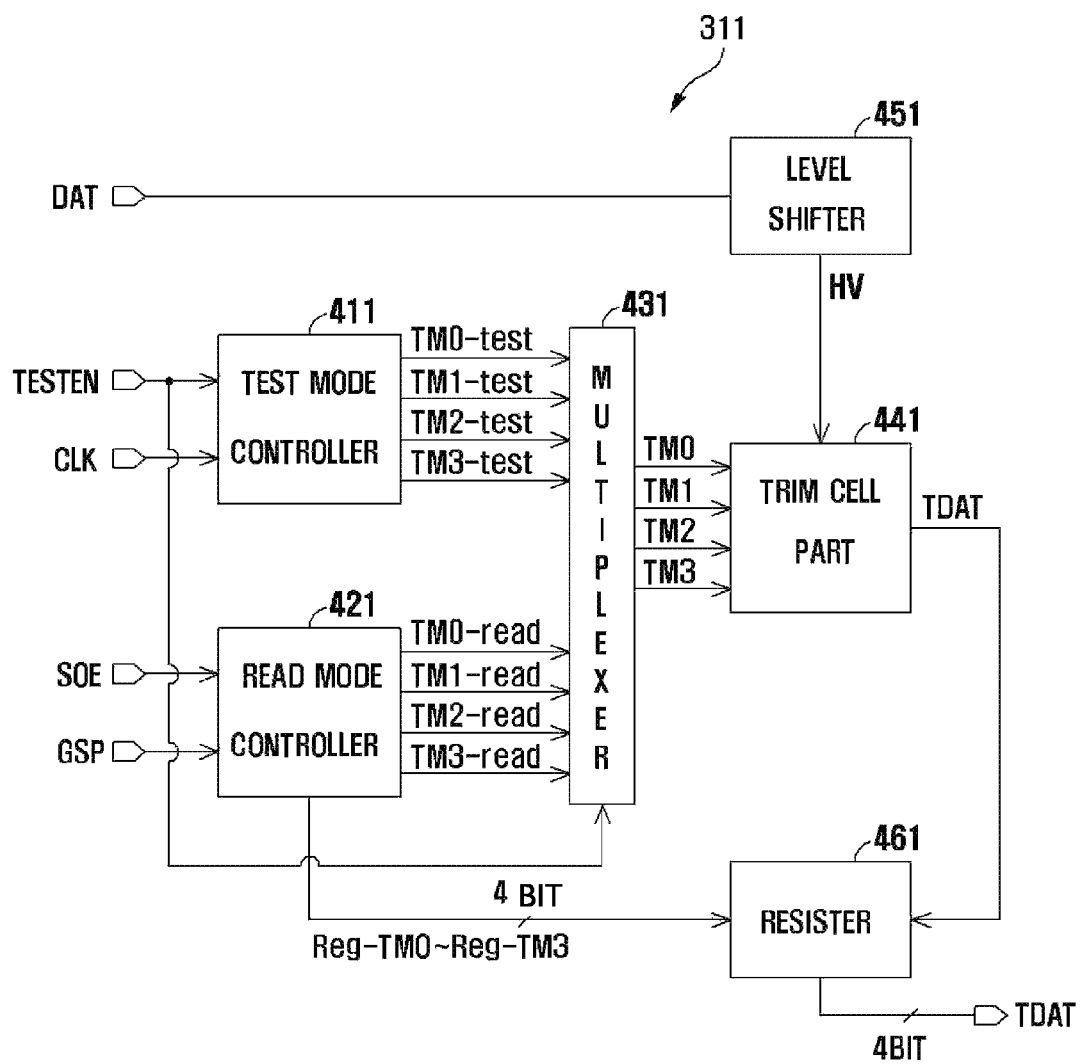
FIG. 4 is a block diagram of a trimming section illustrated in FIG. 3.

FIG. 4 is a block diagram of the trimming section 311 illustrated in FIG. 3. Referring to FIG. 4, the trimming section 311 includes a test mode controller 411, a read mode controller 421, a multiplexer 431, a trim cell part 441, a level shifter 451, and a register 461.

The test mode controller 411 receives the first and second control signals TESTEN and CLK input from an exterior, for example, a test enable signal TESTEN and a clock signal CLK, and outputs four test mode signals TM0-test to TM3-test. Preferably, the first control signal TESTEN is a test enable signal for enabling the test mode, and the second control signal CLK is a clock signal.

When the test enable signal TESTEN is activated, for example, when the test enable signal TESTEN is shifted from logic low to logic high, the test mode starts. After the test mode starts, when the clock signal CLK is input to the test mode controller 411, the test mode controller 411 sequentially outputs the four test mode signals TM0-test to TM3-test synchronized with the clock signal CLK after a predetermined time. The test mode signals TM0-test to TM3-test may be provided to be the same number as that of the trim cells (511 to 514 of FIG. 5). For example, when the number of the trim cells (511 to 514 of FIG. 5) is four, it is preferable that four test mode signals TM0-test to TM3-test are provided.

The read mode controller 421 receives the third and fourth control signals SOE and GSP input from an exterior, and outputs four read mode signals TM0-read to TM3-read. Preferably, the third control signal SOE includes a source output enable signal having a plurality of toggled clocks, and the fourth control signal GSP includes a gate signal pulse having a reset function.

When the source output enable signal SOE is input to the read mode controller 421, the read mode starts, and when the fourth control signal GSP is input, the read mode controller 421 is reset. That is, when the source output enable signal SOE is input to the read mode controller 421, the read mode controller 421 is synchronized with the source output enable signal SOE and sequentially outputs the four read mode signals TM0-read to TM3-read.

The read mode signals TM0-read to TM3-read may be provided to be the same number as that of the trim cells (511 to 514 of FIG. 5). For example, when the number of the trim cells (511 to 514 of FIG. 5) is four, it is preferable that four read mode signals TM0-read to TM3-read are provided.

The multiplexer 431 receives the four test mode signals TM0-test to TM3-test and the four read mode signals TM0-read to TM3-read, and outputs four mode signals TM0 to TM3. The multiplexer 431 is configured to select one of the four test mode signals TM0-test to TM3-test and the four read mode signals TM0-read to TM3-read by the first control signal TESTEN.

For example, as the first control signal TESTEN is activated to logic high, the multiplexer 431 may select the four test mode signals TM0-test to TM3-test to be output as the four mode signals TM0 to TM3, and as the first control signal TESTEN is activated to logic low, the multiplexer 431 may select the four read mode signals TM0-read to TM3-read to be output as the four mode signals TM0 to TM3.

The first control signal TESTEN input to the multiplexer 431 may also be replaced with a separate fifth control signal input from an exterior. At this time, a controller for outputting the fifth control signal may be further provided in an interior or an exterior of the trimming section 311.

The trim cell part 441 includes the four trim cells (511 to 514 of FIG. 5). The trim cell part 441 programs the trim data TDAT in the four trim cells (511 to 514 of FIG. 5) by using the four mode signals TM0 to TM3 provided in correspondence with the test mode and a high voltage HV.

In the test mode, the four mode signals TM0 to TM3 are the four test mode signals TM0-test to TM3-test selected by the multiplexer 431, and the high voltage HV is provided by the level shifter 451 in response to the data DAT. In the read mode, the trim cell part 441 outputs the programmed trim data TDAT of the trim cells (511 to 514 of FIG. 5) in response to the four mode signals TM0 to TM3. In the read mode, the four mode signals TM0 to TM3 are the four read mode signals TM0-read to TM3-read selected by the multiplexer 431.

The trim cells (511 to 514 of FIG. 5) of the trim cell part 441 may be programmed according to a preset trimming code table (refer to Table 1 below). Table 1 below shows an example of the trimming code table. Referring to Table 1, the trimming code table includes 16 trimming codes "0000" to "1111". That is, the level of the bias current (SIDD of FIG. 3) is classified into 16 ranges and one trimming code is assigned to each range. At this time, a group including an optimal bias current (SIDD of FIG. 3) level is set as a default trimming code, for example, "0000". Since the number of the trimming codes is 16, it is preferable that each trimming code includes four bits. Preferably, if the number of the trimming codes increases, the number of bits constituting each trimming code is configured to increase, and if the number of the trimming codes decreases, the number of bits constituting each trimming code is configured to decrease.

TABLE 1

| Bias current range | | |
|---|---|---|
| from | to | Trimming code |
| 9.8 | 10.0 | 0000 |
| 9.6 | 9.8 | 0001 |
| 9.4 | 9.6 | 0010 |
| 9.2 | 9.4 | 0011 |
| 9.0 | 9.2 | 0100 |
| 8.8 | 9.0 | 0101 |
| 8.6 | 8.8 | 0110 |
| 8.4 | 8.6 | 0111 |
| 10.0 | 10.2 | 1000 |
| 10.2 | 10.4 | 1001 |
| 10.4 | 10.6 | 1010 |
| 10.6 | 10.8 | 1011 |
| 10.8 | 11.0 | 1100 |
| 11.0 | 11.2 | 1101 |
| 11.2 | 11.4 | 1110 |
| 11.4 | 11.6 | 1111 |

The trimming codes of Table 1 above indicate the data DATA, and may be understood as the trim data TDAT programmed in the trim cells (511 to 514 of FIG. 5) of the trim cell part 441.

The trim cell part 441 includes four trim cells (511 to 514 of FIG. 5) and a blocking portion (540 of FIG. 5).

FIG. 5 is a circuit diagram of the trim cell part 441 illustrated in FIG. 4. Referring to FIG. 5, the trim cells 511 to 514 include four trim capacitors 521 to 524 and four NMOS transistors 531 to 534, respectively.

For example, the first trim cell 511 includes one trim capacitor 521 and one NMOS transistor 531 which are serially connected to each other.

Preferably, each of the four trim capacitors 521 to 524 includes a NMOS capacitor, and a gate serves as an input terminal and a drain and a source, which are commonly connected to each other, serve as an output terminal. The input terminal of the trim capacitor 521 is connected to a node N1 and the output terminal is connected to the NMOS transistor 531. The trim capacitor 521 in a normal state does not provide a current path.

When gate oxide constituting the input terminal of the trim capacitor 521 is destroyed, a current path is formed in the interior of the trim capacitor 521. In this state, a voltage of the input terminal of the trim capacitor 521 is output through the output terminal, and the voltage output from the trim capacitor 521 is applied to the drain of the NMOS transistor 531. In order to form a current path in the interior of the trim capacitor 521, it is necessary to apply a high voltage and destroy the gate oxide.

The NMOS transistor 531 is configured such that a drain is connected to the trim capacitor 521, a gate receives the mode signal TM0, and a source is connected to the ground GND. Accordingly, when the mode signal TM0 is inactivated to logic low, the NMOS transistor 531 is turned off and a voltage applied to the drain is maintained as is. However, when the mode signal TM0 is activated to logic high, the NMOS transistor 531 is turned on and a voltage level applied to the drain is lowered to a ground voltage (GND) level. The NMOS transistor 531 may also include a PMOS transistor or a bipolar transistor.

The mode signals TM0 to TM3 applied to the gates of the NMOS transistors 531 to 534 are sequentially applied at a predetermined time interval.

Preferably, the trim data TDAT output from the trim cells 511 to 514 includes signals of four bits, which are sequentially output in correspondence with the mode signals TM0 to TM3. However, the present invention is not limited thereto, and the trim data TDAT may be configured to exceed four bits or be smaller than four bits. The trim data TDAT is decided by the number of the trim cells 511 to 514 provided in the trimming section 311. That is, when the number of the trim cells 511 to 514 is four, the trim data TDAT includes four bits, and when the number of the trim cells 511 to 514 is three, the trim data TDAT includes three bits.

The blocking portion 540 prevents the output of the level shifter (451 of FIG. 4) applied to the node N1 from being transferred to the exterior of the trim cells 511 to 514, that is, the register 461. The blocking portion 540 may include a diode 541. In this case, a cathode of the diode 541 is connected to the node N1. Accordingly, the output of the level shifter (451 of FIG. 4) applied to the node N1 may be applied only to the trim cells 511 to 514. However, a voltage applied to an anode of the diode 541 is transferred to the trim cells 511 to 514 through the diode 541. In this case, LV indicates a voltage applied from the register 461 and corresponds to the trim data TDAT. Since the output of the level shifter 451 has a level higher than the voltage applied to the register 461, the voltage is expressed by HV for distinction from LV, wherein HV is defined as a high voltage.

The level shifter 451 receives the data DAT from an exterior and outputs the high voltage HV obtained by increasing the voltage level of the data DAT. That is, the level shifter 451 increases the data DAT to a level higher than the supply voltage of the source driver (111 of FIG. 2), and outputs the high voltage HV.

As the data DAT, one of the preset trimming codes (refer to the trimming code table of Table 1 above) may be selected and provided in order to adjust the current level of the bias current within the prescribed range. The data DAT may be described as the input of "0000" for example. The level shifter 451 outputs high voltages HV having different levels in correspondence with values "0" and "1" of the data DAT, and the high voltage HV corresponding to the value "1" of the data DAT is set as a voltage capable of destroying gate oxide constituting the input terminals of the trim capacitors 521 to 524. Preferably, the high voltage HV corresponding to the value "0" of the data DAT also has a level higher than the voltage LV applied to the register 461.

The register 461 is connected to the trim cell part 441, the read mode controller 421, and the decoder 312. The register 461 reads the trim data TDAT programmed in the trim cell part 441 in response to a signal Reg_TMx output from the read mode controller 421, and outputs the trim data TDAT to the decoder 312. The trim data TDAT may be stored in the register 461 and may also be output in the stored state according to a request from an exterior.

Figure 6:
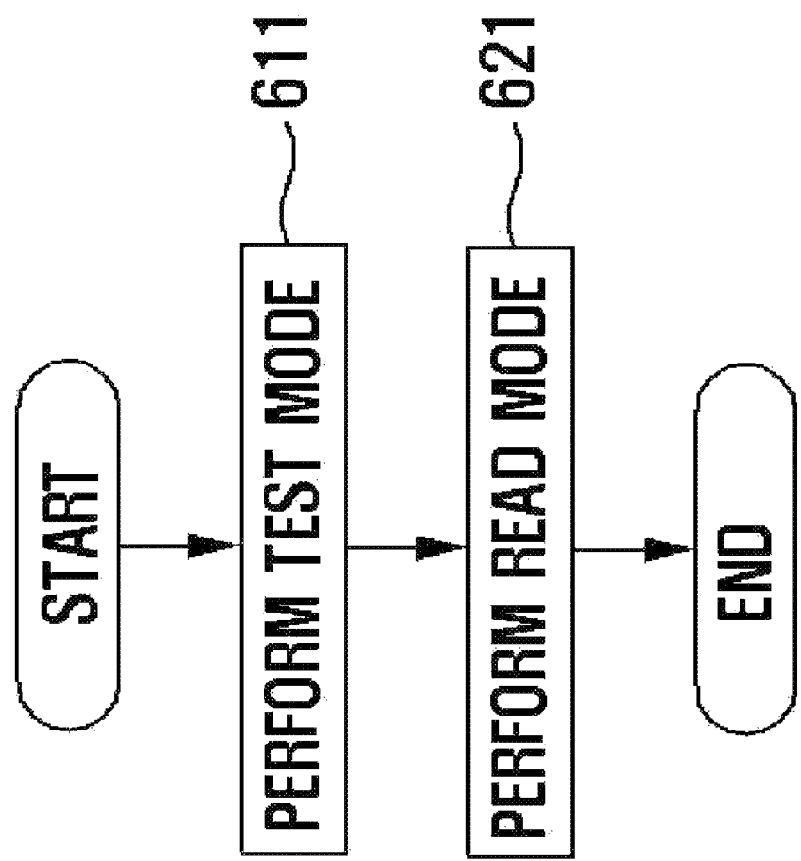
FIG. 6 is a flowchart illustrating a bias current adjusting method of the present invention.
Figure 7:
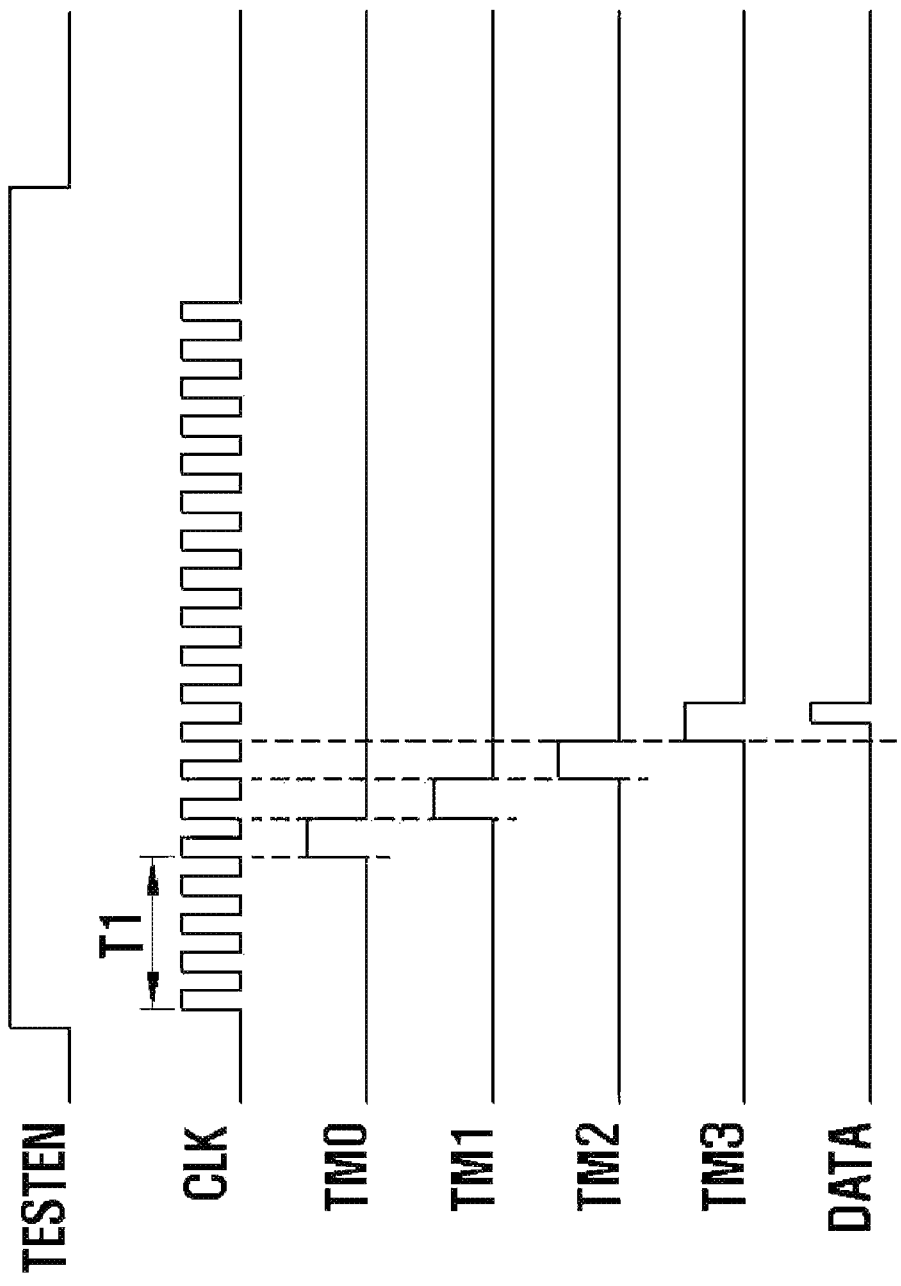
FIG. 7 is a timing diagram of signals in a test mode.
Figure 8:
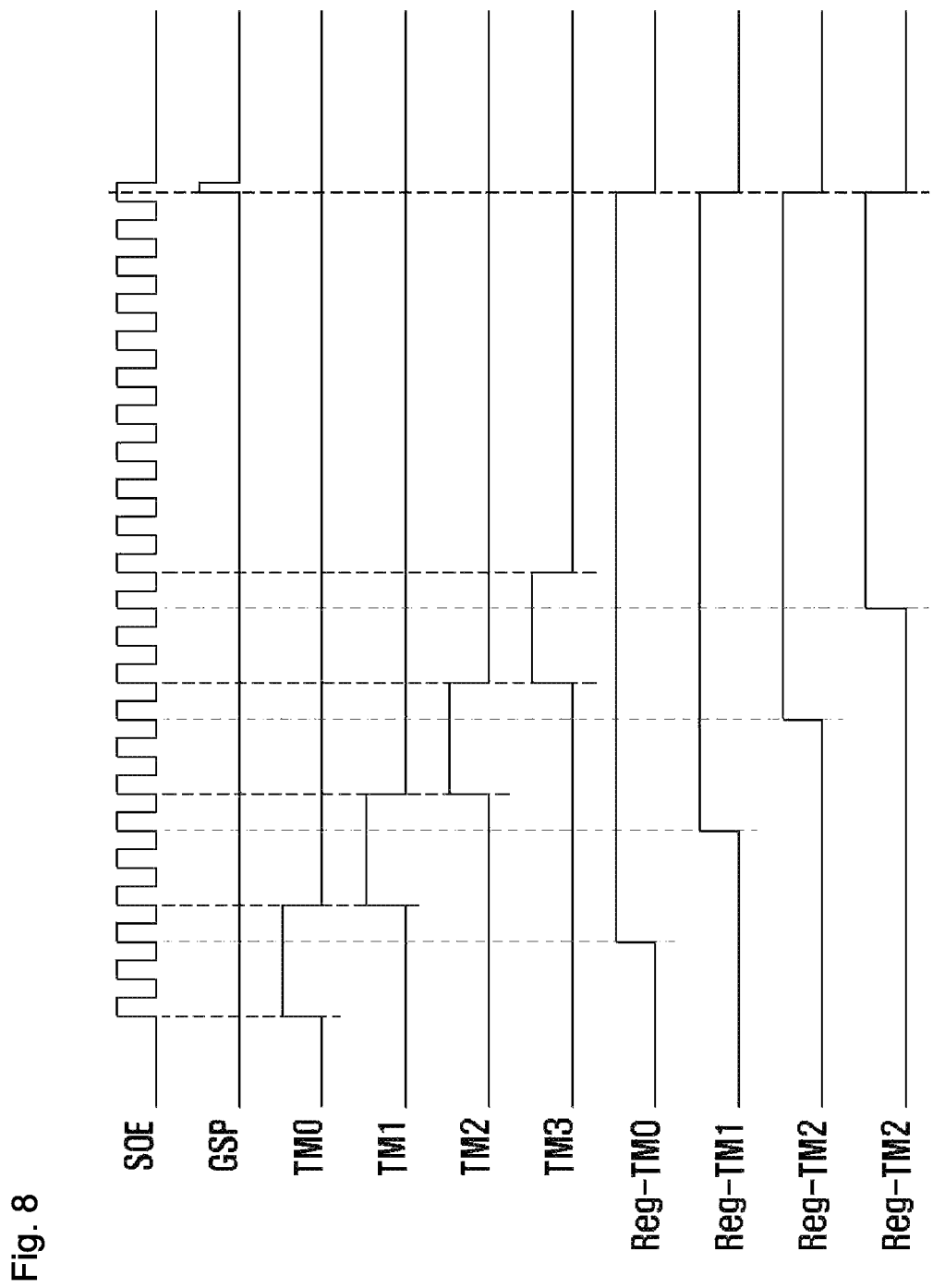
FIG. 8 is a timing diagram of signals in a read mode.

FIG. 6 is a flowchart illustrating an embodiment of a bias current adjusting method of the source driver according to the present invention, FIG. 7 is a timing diagram of signals in the test mode, and FIG. 8 is a timing diagram of signals in the read mode. With reference to FIG. 4, FIG. 5, FIG. 7, and FIG. 8, the embodiment of the bias current adjusting method of the source driver illustrated in FIG. 6 will be described.

A bias current of a source driver manufactured as a semiconductor integrated circuit may be measured in a test process of a wafer level or a package level.

When it is determined that the bias current deviates from a permission range or is required to be adjusted, the bias current may be adjusted by the embodiment of the bias current adjusting method of the present invention.

Data DAT for adjusting the bias current may be decided in advance as shown in Table 1 above with reference to a test result. That is, the data DAT may be decided on the basis of a current bias current of a source driver measured by test equipment, and may be set to have one of the trimming codes of preset Table 1 above.

The source driver performs a test mode of programming the data DAT in the trim cell part 441 of the trimming section 311 in order to adjust the bias current, and the test mode may be defined as first step S611.

When the first control signal TESTEN input to the test mode controller 411 is activated to logic high from logic low, the trimming section 311 enters the test mode. In the test mode, the test mode controller 411 receives the second control signal CLK. After the second control signal CLK is input and a predetermined time T1 passes, the test mode controller 411 sequentially outputs the test mode signals TM0-test to TM3-test in synchronization with the second control signal CLK. In the test mode, the multiplexer 431 selects the test mode signals TM0-test to TM3-test and provides the trim cell part 441 with the mode signals TM0 to TM3. Consequently, the NMOS transistors 531 to 534 of the four trim cells 511 to 514 in the trim cell part 441 are sequentially turned on by the mode signals TM0 to TM3 sequentially enabled.

The data DAT for the programming of the trim cells 511 to 514 are input to the level shifter 451 in correspondence with the test mode. The data DAT may be decided as described above, and is set to "0010" for example.

The level shifter 451 outputs a high voltage HV capable of destroying the gate oxide constituting the input terminals of the trim capacitors 521 to 524 in correspondence with the value "1" included in the data DAT.

In the level shifter 451, bit values of the data DAT correspond to the mode signals TM0 to TM3 sequentially enabled. In more detail, a high voltage HV of the level shifter 451 corresponding to the first value of the data DAT is provided to the trim cell part 441 at the time point at which the mode signal TM0 has been enabled by the test mode signal TM0-test, a high voltage HV of the level shifter 451 corresponding to the second value "0" of the data DAT is provided to the trim cell part 441 at the time point at which the mode signal TM1 has been enabled by the test mode signal TM1-test, a high voltage HV of the level shifter 451 corresponding to the third value of the data DAT is provided to the trim cell part 441 at the time point at which the mode signal TM2 has been enabled by the test mode signal TM2-test, and a high voltage HV of the level shifter 451 corresponding to the fourth value "0" of the data DAT is provided to the trim cell part 441 at the time point at which the mode signal TM3 has been enabled by the test mode signal TM3-test.

Accordingly, at the time point at which the test mode signal TM3-test is activated, the NMOS transistor 533 is turned on, the gate oxide of the trim capacitor 523 is destroyed by the high voltage HV corresponding to the third value "1" of the data DAT, and thus a current path is formed in the trim cell 513. The gate oxide of the other trim capacitors 521, 522, and 524 is not destroyed because the high voltage HV corresponding to "0" is applied.

In the aforementioned test mode according to the embodiment of the present invention, a current path corresponding to the data DAT is selectively formed in the trim cells 511 to 514. At this time, trim data TDAT output from a trim cell including a trim capacitor, in which the current path has been formed, is expressed by "0", and trim data TDAT output from a trim cell including a trim capacitor, in which no current path has been formed, is expressed by "1". That is, the trim data TDAT may be programmed in the trim cells 511 to 514.

As described above, by the test mode operation of the trimming section 311, the trim data TDAT may be programmed in the trim cell part 441, and may be read in the read mode. The read mode performed in the trimming section 311 may be defined as second step S621.

In correspondence with the read mode, the third control signal SOE is input to the read mode controller 421. The read mode controller 421 sequentially outputs the four read mode signals TM0-read to TM3-read in synchronization with the third control signal SOE. The four read mode signals TM0-read to TM3-read output from the read mode controller 421 are converted into the four mode signals TM0 to TM3 via the multiplexer 431, and are transferred to the trim cell part 441. The four NMOS transistors 531 to 534 provided in the four trim cells 511 to 514 are sequentially turned on by the four mode signals TM0 to TM3 sequentially input. Accordingly, the trim data TDAT programmed in the trim cells 511 to 514 may be sequentially provided to the register 461. The trim data TDAT has values corresponding to the current path formation states of the trim cells 511 to 514.

Furthermore, the read mode controller 421 provides the register 461 with register control signals Reg_TM0 to Reg_TM3. The register control signals Reg_TM0 to Reg_TM3 are configured to have the same number of bits (for example, four bits) as those of the mode signals TM0 to TM3. Preferably, after the mode signals TM0 to TM3 having the same phases as those of the read mode signals TM0-read to TM3-read are enabled, the register control signals Reg_TM0 to Reg_TM3 are enabled and maintain the enable state until the read mode controller 421 is reset by the fourth control signal GSP.

The register 461 reads the trim data TDAT, which is sequentially provided by the trim cells 511 to 514, in response to the register control signals Reg_TM0 to Reg_TM3. That is, when the mode signals TM0 to TM3 having the same phases as those of the read mode signals TM0-read to TM3-read are applied to the trim cell including the trim capacitor, in which the current path has been formed, the trim cell provides the trim data TDAT as a value of "1". When the mode signals TM0 to TM3 having the same phases as those of the read mode signals TM0-read to TM3-read are applied to the trim cell including the trim capacitor, in which no current path has been formed, the trim cell provides the trim data TDAT as a value of "0". The register 461 stores the trim data TDAT sequentially provided and transmits the trim data TDAT to the decoder 312 as a signal of four bits.

The fourth control signal GSP input to the read mode controller 421 is for reset. Accordingly, when the fourth control signal GSP is activated to logic high from logic low, the read mode controller 421 is reset and stops the output of the four read mode signals TM0-read to TM3-read and the register control signals Reg_TM0 to Reg_TM3.

As described above, the trimming section 311 performs the read mode, thereby reading the trim data TDAT programmed in the trim cell part 441 and outputting the read trim data TDAT to the decoder 312.

As described above, the decoder 312 receives trim data TDAT of four bits, and provides the bias current supply unit 321 with a bias current adjusting signal SIA of 16 bits corresponding to the trim data TDAT.

The bias current supply unit 321 provides the bias current SIDD in correspondence with the bias current adjusting signal SIA. At this time, the bias current SIDD provided by the bias current supply unit 321 has a level adjusted to correspond to the prescribed range.

As described above, a source driver, which is determined as a defect because the bias current SIDD deviates from the prescribed range, may be adjusted to a good product through the bias current adjustment according to the embodiment of the present invention. As a consequence, according to the embodiment of the present invention, it is possible to improve the yield of source drivers and reduce the manufacturing cost of the source drivers.

Furthermore, when the bias current of the source driver has deviation by the influence of semiconductor manufacturing environments, data DAT for overcoming the deviation can be selected in the test mode, trim data TDAT corresponding to the selected data DAT can be programmed in the trim cell part 441 in the test mode, and the bias current SIDD of the source driver can be adjusted using the trim data TDAT programmed in the trim cell part 441 in the read mode. By the bias current adjustment according to the embodiment of the present invention, deviation of the bias current among source drivers can be reduced from about ±30% to about ±5%.

Consequently, according to the embodiment of the present invention, a block dim phenomenon occurring in a display panel can be prevented, so that the driving state of the display panel can be improved.

Furthermore, according to the embodiment of the present invention, it is possible to perform correction for the case in which the bias current SIDD is changed to an abnormal state by electrical overstress (EOS) or electrostatic discharge (ESD) noise.

While various embodiments have been described above, it will be understood to those skilled in the art that the embodiments described are by way of example only. Accordingly, the disclosure described herein should not be limited based on the described embodiments.

What is claimed is:

1. A source driver comprising:
   a bias current supply unit that supplies a bias current adjusted in correspondence with a bias current adjusting signal; and
   a bias current adjusting signal generation unit that programs trim data by using data provided from an exterior, and provides the bias current adjusting signal corresponding to the programmed trim data, wherein the bias current adjusting signal generation unit comprises a trimming section that performs programming of the trim data by using the data and provides the programmed trim data, wherein the trimming section comprises a trim cell part that includes a plurality of trim cells, and programs the trim data corresponding to the data in the plurality of trim cells.

2. The source driver according to claim 1, wherein the bias current supply unit is configured to provide the bias current to an output buffer that outputs a source driving signal.

3. The source driver according to claim 1, wherein the bias current adjusting signal generation unit further comprises:
   a decoder that decodes the trim data and outputs the bias current adjusting signal.

4. The source driver according to claim 1, wherein the trimming section further comprises:
   a test mode controller that provides a test mode signal in correspondence with a test mode;
   a read mode controller that provides a read mode signal in correspondence with a read mode; and
   a multiplexer that selects one of the test mode signal and the read mode signal in correspondence with the test mode and the read mode, and outputs a mode signal,
   wherein the trim cell part programs the trim data corresponding to the data in the plurality of trim cells by using the mode signal corresponding to the test mode signal, and outputs the trim data programmed in the plurality of trim cells by using the mode signal corresponding to the read mode signal.

5. The source driver according to claim 4, wherein the trim cell includes a trim transistor and a MOS transistor, which are serially connected to each other, the MOS transistor operates in correspondence with the mode signal, and in a state in which the mode signal has been enabled, programming of the trim data for the trim capacitor or read of the trim data programmed in the trim capacitor is performed.

6. The source driver according to claim 5, wherein the programming of the trim data is performed by application of a high voltage corresponding to a value of the data, selective destruction of gate oxide of an input terminal of the trim capacitor, and selective formation of a current path through the trim capacitor according to destruction or non-destruction of the gate oxide.

7. The source driver according to claim 4, wherein the trimming section further comprises:
   a level shifter that receives the data, and provides the trim cell part with a high voltage having a level, which is higher than a supply voltage used in the source driver and corresponds to a value of the data, for programming of the trim data.

8. The source driver according to claim 4, further comprising:
   a register that is connected to the trim cell part, and reads and outputs the trim data of the trim cell part in correspondence with the read mode.

9. A source driver comprising:
   a trimming section that performs programming of trim data by using data provided from an exterior, and provides the programmed trim data; and
   a decoder that decodes the trim data and outputs a bias current adjusting signal for adjusting a bias current that drives an output current,
   wherein the trimming section comprises a trim cell part that includes a plurality of trim cells, and programs the trim data corresponding to the data in the plurality of trim cells.

10. The source driver according to claim 9, wherein the trimming section further comprises:
    a test mode controller that provides a test mode signal in correspondence with a test mode;
    a read mode controller that provides a read mode signal in correspondence with a read mode;
    a multiplexer that selects one of the test mode signal and the read mode signal in correspondence with the test mode and the read mode, and outputs a mode signal; and
    a level shifter that receives the data, and provides a high voltage having a level that is higher than a supply voltage used in the source driver and corresponds to a value of the data,
    wherein the trim cell part controls the high voltage to be applied to the plurality of trim cells by using the mode signal corresponding to the test mode, and outputs the trim data programmed in the plurality of trim cells by using the mode signal corresponding to the read mode signal.

* * * * *